United States Patent
Wilson et al.

(10) Patent No.: US 9,462,712 B2
(45) Date of Patent: *Oct. 4, 2016

(54) PORTABLE ELECTRONIC DEVICE CASE

(71) Applicant: Wimo Labs LLC, Chicago, IL (US)

(72) Inventors: Scott Harold Wilson, Chicago, IL (US); Dennis Matthew Puhalla, Chicago, IL (US); Jon Godston, Chicago, IL (US); Kevin Gerard Brennan, Wheaton, IL (US)

(73) Assignee: Wimo Labs LLC, Chicago, IL (US)

( * ) Notice: Subject to any disclaimer, the term of this patent is extended or adjusted under 35 U.S.C. 154(b) by 163 days.

This patent is subject to a terminal disclaimer.

(21) Appl. No.: 14/272,037

(22) Filed: May 7, 2014

(65) Prior Publication Data

US 2014/0238894 A1 Aug. 28, 2014

Related U.S. Application Data

(63) Continuation of application No. 13/494,170, filed on Jun. 12, 2012, now Pat. No. 8,787,009, which is a continuation-in-part of application No. 29/418,314, filed on Apr. 13, 2012, now Pat. No. Des. 683,338.

(51) Int. Cl.
*G06F 1/16* (2006.01)
*H05K 5/02* (2006.01)
(Continued)

(52) U.S. Cl.
CPC ............... *H05K 5/0217* (2013.01); *F16F 7/00* (2013.01); *H04M 1/185* (2013.01)

(58) Field of Classification Search
CPC ......... G06F 3/041; G06F 1/16; G02F 1/1333
USPC ......... 206/586, 1.5, 775, 231, 338; 348/376; 362/206, 474, 489, 23.19, 237, 267, 362/235, 294, 187, 373, 218, 191; 361/679.55, 679.02, 679.32, 679.08, 361/679.09, 679.52, 679.26, 679.47, 361/679.54, 679.31, 679.01, 679.33; 248/633, 636, 483, 454, 455, 459, 174, 248/152

See application file for complete search history.

(56) References Cited

U.S. PATENT DOCUMENTS 6,068,119 A 5/2000 Derr et al.
6,094,785 A 8/2000 Montgomery et al.
(Continued)

FOREIGN PATENT DOCUMENTS

EP 0527712 A1 2/1993
KR 200421862 7/2006

OTHER PUBLICATIONS

International Search Report of International Patent Application Publication No. WO2013/188342, dated Sep. 24, 2013, pp. 1-2.

*Primary Examiner* — Hung Duong
(74) *Attorney, Agent, or Firm* — Neal, Gerber & Eisenberg LLP

(57) ABSTRACT

Various embodiments of the present disclosure provide a flexible boot for at least partially encompassing an electronic device. In one embodiment, the boot includes a rear panel and a sidewall extending from the real panel. The sidewall includes an inner surface, an outer surface, and a plurality of compressible hollow regions positioned between the inner surface and the outer surface. The rear panel and the inner surface of the sidewall at least partially define a cavity configured to receive the device. Other embodiments of the present disclosure provide a case for housing an electronic device. In one embodiment, the case includes an elastomeric boot and a rigid posterior portion defining an opening therethrough through which a portion of the boot extends. The boot includes a sidewall and is configured to receive the device such that the sidewall at least partially surrounds a plurality of lateral sides of the device.

20 Claims, 9 Drawing Sheets

(51) Int. Cl.
*H04M 1/18* (2006.01)
*F16F 7/00* (2006.01)

(56) References Cited

U.S. PATENT DOCUMENTS

| | | | |
|---|---|---|---|
| 6,317,313 | B1 | 11/2001 | Mosgrove et al. |
| 6,415,138 | B2 | 7/2002 | Sirola et al. |
| 6,525,928 | B1 | 2/2003 | Madsen et al. |
| 6,536,589 | B2 | 3/2003 | Chang |
| 6,646,864 | B2 | 11/2003 | Richardson |
| 6,659,274 | B2 | 12/2003 | Enners |
| 6,995,976 | B2 | 2/2006 | Richardson |
| 7,158,376 | B2 | 1/2007 | Richardson et al. |
| 7,180,735 | B2 | 2/2007 | Thomas et al. |
| 7,230,823 | B2 | 6/2007 | Richardson et al. |
| 7,312,984 | B2 | 12/2007 | Richardson et al. |
| 7,449,650 | B2 | 11/2008 | Richardson et al. |
| D600,908 | S | 9/2009 | Richardson et al. |
| 7,609,512 | B2 | 10/2009 | Richardson et al. |
| 7,612,997 | B1 | 11/2009 | Diebel et al. |
| 7,663,879 | B2 | 2/2010 | Richardson et al. |
| 7,688,580 | B2 | 3/2010 | Richardson et al. |
| D615,536 | S | 5/2010 | Richardson et al. |
| D616,360 | S | 5/2010 | Huang |
| D616,361 | S | 5/2010 | Huang |
| D617,784 | S | 6/2010 | Richardson et al. |
| D617,785 | S | 6/2010 | Richardson et al. |
| 7,782,610 | B2 | 8/2010 | Diebel et al. |
| 7,889,489 | B2 | 2/2011 | Richardson et al. |
| 7,889,498 | B2 | 2/2011 | Diebel et al. |
| D634,741 | S | 3/2011 | Richardson et al. |
| 7,907,394 | B2 | 3/2011 | Richardson et al. |
| D636,386 | S | 4/2011 | Richardson et al. |
| 7,933,122 | B2 | 4/2011 | Richardson et al. |
| 7,957,524 | B2 | 6/2011 | Chipping |
| D653,202 | S | 1/2012 | Hasbrook et al. |
| D659,094 | S | 5/2012 | Brand et al. |
| 8,204,561 | B2 | 6/2012 | Mongan et al. |
| D669,458 | S | 10/2012 | Wilson et al. |
| 8,286,789 | B2 | 10/2012 | Wilson et al. |
| 8,312,991 | B2 | 11/2012 | Diebel et al. |
| 8,328,008 | B2 | 12/2012 | Diebel et al. |
| D675,161 | S | 1/2013 | Rayner |
| 8,342,325 | B2 | 1/2013 | Rayner |
| 8,367,235 | B2 | 2/2013 | Huang |
| 8,393,466 | B2 | 3/2013 | Rayner |
| 8,395,894 | B2 | 3/2013 | Richardson et al. |
| 8,442,604 | B1 | 5/2013 | Diebel |
| 8,457,701 | B2 | 6/2013 | Diebel |
| D685,327 | S | 7/2013 | Rayner |
| 8,483,758 | B2 | 7/2013 | Huang |
| 8,505,718 | B2 | 8/2013 | Griffin, Jr. et al. |
| 8,509,864 | B1 | 8/2013 | Diebel |
| 8,526,180 | B2 | 9/2013 | Rayner |
| 8,531,834 | B2 | 9/2013 | Rayner |
| 8,548,541 | B2 | 10/2013 | Rayner |
| 8,564,950 | B2 | 10/2013 | Rayner |
| 8,567,599 | B2 | 10/2013 | Beatty et al. |
| 8,570,737 | B2 | 10/2013 | Rayner |
| 2005/0168638 | A1 | 8/2005 | Iwata |
| 2011/0159324 | A1 | 6/2011 | Huang et al. |
| 2011/0287726 | A1 | 11/2011 | Huang |
| 2011/0297578 | A1 | 12/2011 | Stiehl |
| 2012/0043236 | A1 | 2/2012 | Szucs et al. |
| 2012/0320020 | A1 | 12/2012 | Chiba |
| 2013/0043777 | A1 | 2/2013 | Rayner |
| 2013/0092576 | A1 | 4/2013 | Rayner |
| 2013/0092584 | A1* | 4/2013 | Sheehy ............... B65H 75/32 206/403 |
| 2013/0181584 | A1 | 7/2013 | Whitten et al. |
| 2013/0312749 | A1* | 11/2013 | Bornn ............... A61M 16/06 128/203.29 |

* cited by examiner

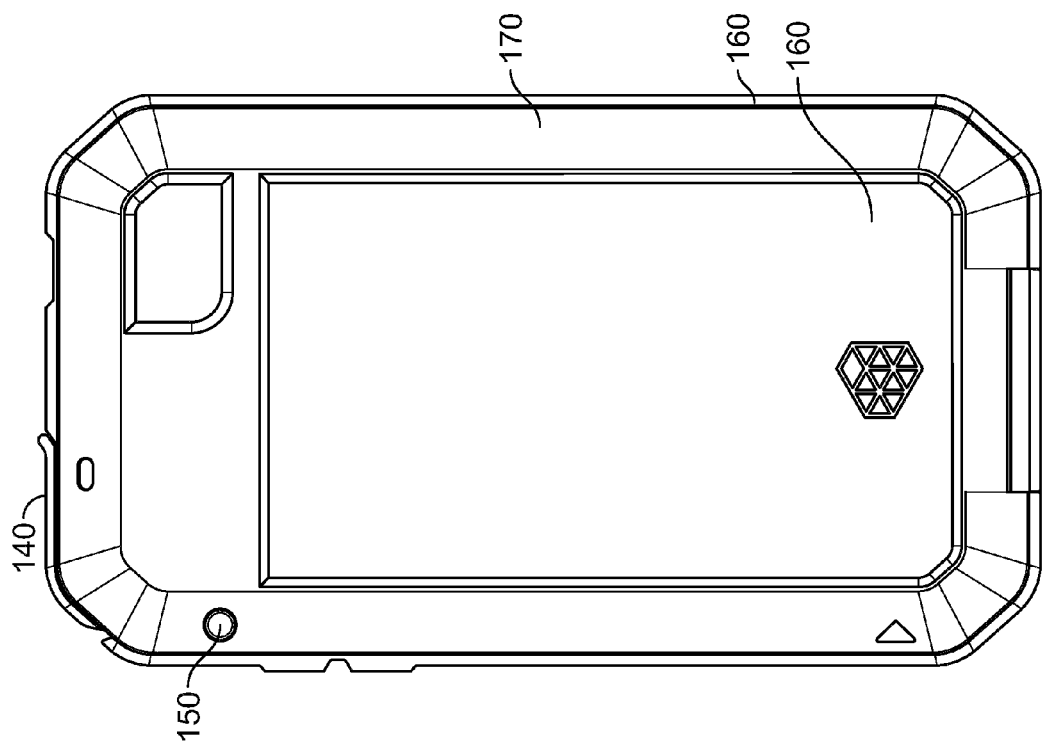
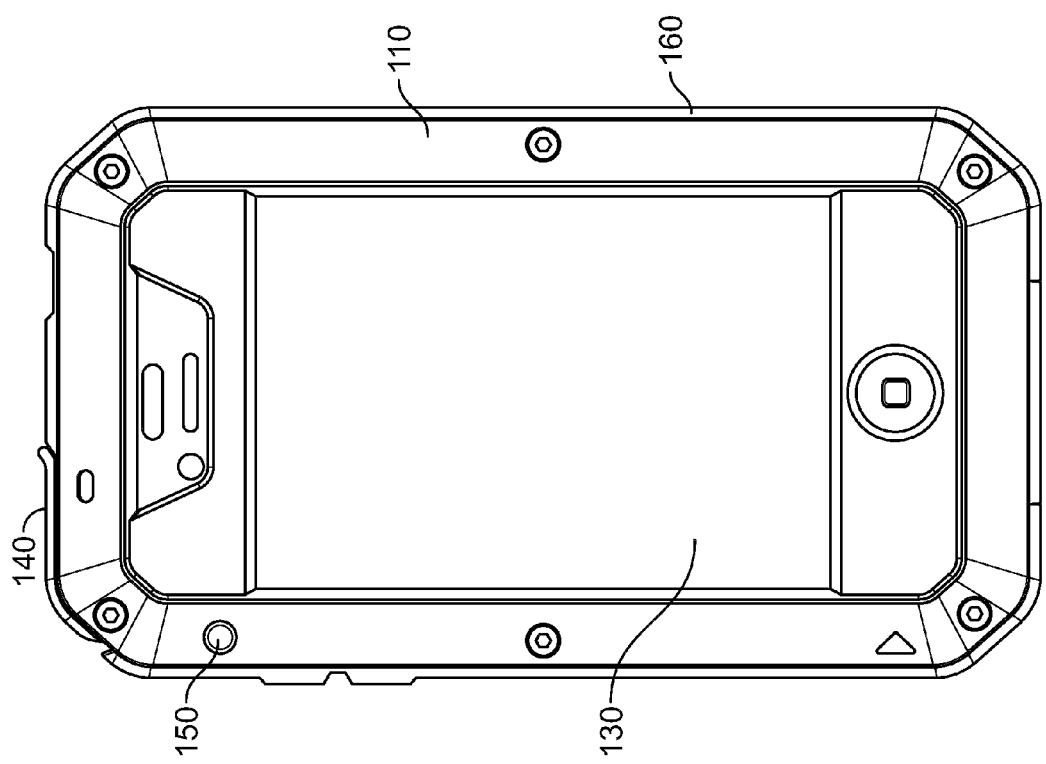

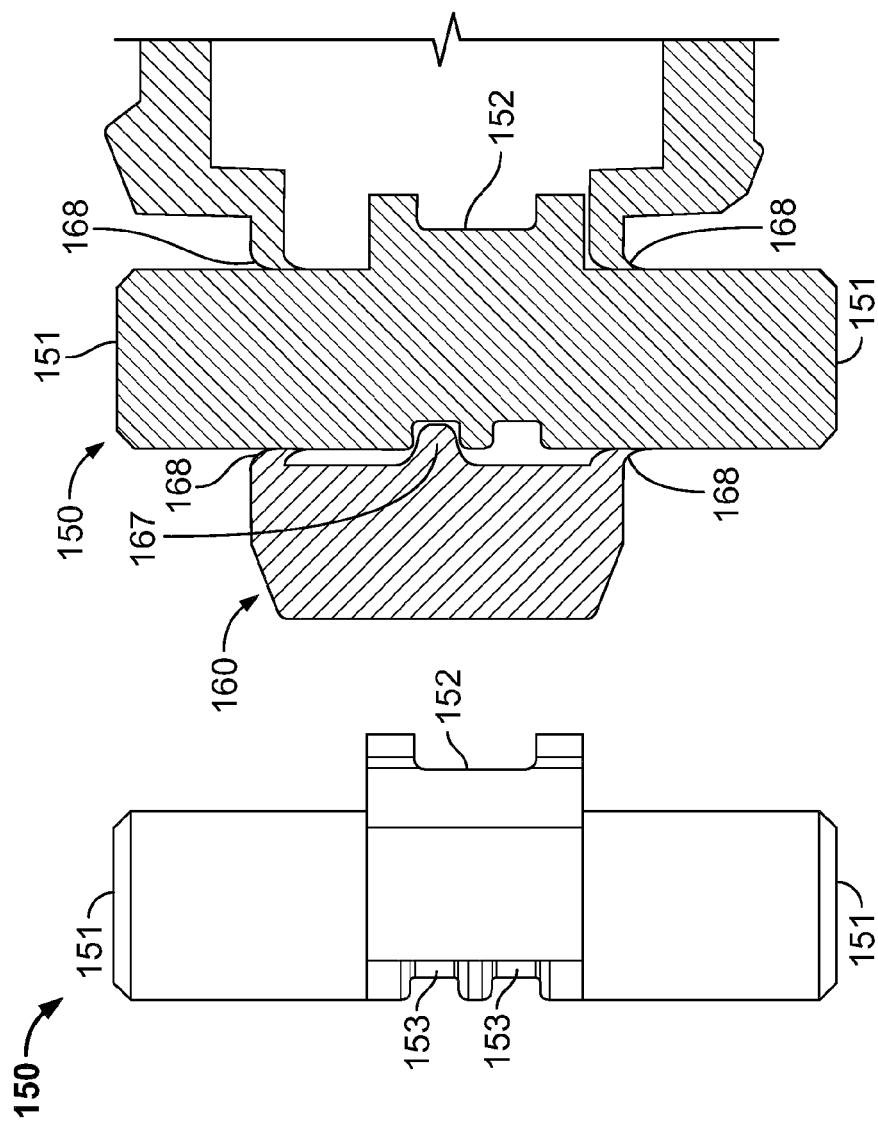
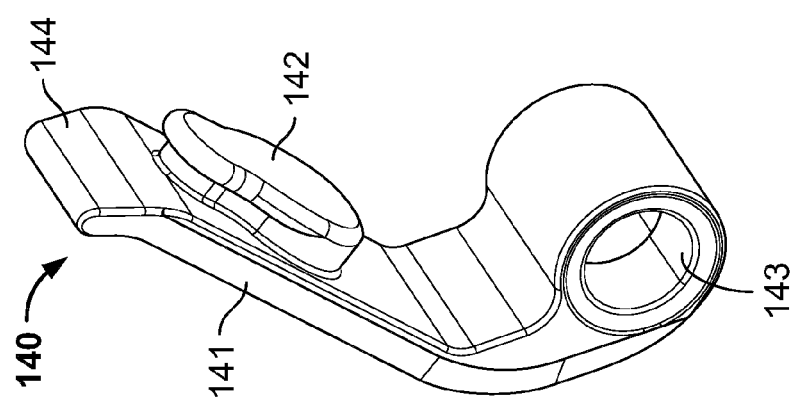

PORTABLE ELECTRONIC DEVICE CASE

PRIORITY CLAIM

This application is a continuation of, and claims priority to and the benefit of, U.S. patent application Ser. No. 13/494,170, filed on Jun. 12, 2012, which is a continuation-in-part of, and claims priority to and the benefit of, U.S. Design patent application No. 29/418,314, filed on Apr. 13, 2012, which issued as U.S. Design Pat. No. D683,338 on May 28, 2013, the entire contents of each of which are incorporated herein by reference.

BACKGROUND

Generally, this application relates to cases for portable electronic devices. A case may be used to protect a portable electronic device (or, more simply, a "device").

A case may be designed to attempt to protect a device from collisions or impacts. A case may be designed to attempt to protect a device from contaminants or contamination. Such contaminants or contamination may include liquids, particulates, heat, cold, moisture, humidity, dirt, dust, and/or any other externally generated influence that may compromise the functionality of the device. A case may also be designed to protect interactive parts of the device (for example, touch screen) from scratching.

It may be desirable to have a case that provides improved protection from collisions/impacts, contamination, and/or scratching.

SUMMARY

A case for holding a portable electronic device includes an anterior portion, a posterior portion, a boot, a transparent covering portion, and a plurality of fasteners. The anterior portion may have a front surface, a back surface, and a screen window. The posterior portion may have a front surface and a back surface. The boot may be flexible and may fit around the portable electronic device. The boot may have a sidewall, a flange extending inwardly from the sidewall, and a rear panel. The sidewall may be between the anterior portion and the posterior portion. The transparent covering portion may have an outer edge, a front surface, and a back surface. The outer edge may be between the boot and the back surface of the anterior portion. The plurality of fasteners may fasten the anterior portion and the posterior portion.

The case may include an audio port cover including an aperture, an arm extending from the aperture, and a plug on a bottom surface of the arm. The audio port cover may be secured to the case by a connection through the aperture. The arm may rotate about the aperture of the audio port cover and along a primary plane of the boot. The plug may engage in an audio port aperture in the sidewall of the boot.

The case may include an audio port hollow region within the sidewall of the boot. The audio port hollow region may be located to allow access to an audio port of the portable electronic device. The case may also include an audio port aperture through the sidewall of the boot. The audio port aperture may be located to allow access into the audio port hollow region and to the audio port of the portable electronic device. The case may also include an acoustic piping aperture through the sidewall of the boot. The acoustic piping aperture may be located to allow sound to enter the audio port hollow region even when the audio port aperture is plugged. The case may have a bumper within the sidewall of the boot. The bumper may have hollow regions separated by partitions. The partitions may comprise a truss.

The case may include vibration switch actuator, which may have a post and a cup. The cup may be located on a lateral surface of the post. The post may slidably extend through vibration switch actuator apertures in the sidewall of the boot. The cup may be arranged to interface with a vibration switch on the portable electronic device and switch the vibration switch ON and OFF as the post slides in and out. The vibration switch actuator may include an ON detent and an OFF detent. The boot may include a stop nub located to engage with the ON detent and the OFF detent. The stop nub may be arranged to alternately snap into the ON detent or the OFF detent. This may stop a movement the vibration switch actuator and provide a physical pulse to indicate a change in position of the vibration switch actuator.

The boot may include wiper seals proximate the vibration switch actuator apertures in the boot. The wiper seals may be located to form seals with the vibration switch actuator. The posterior portion may include a rear window. The boot may also include a rear window and a rear window seal surrounding the rear window. The rear window seal of the boot may compress against the back side of the device.

The sidewall of the boot may include at least one actuator (for example, volume up actuator, a volume down actuator, or a power actuator) arranged to receive an actuation force on an outer area of the sidewall and to translate the actuation force towards a switch on the portable electronic device. The anterior portion may include a lip configured to compress an outer region of the transparent covering portion against the portable electronic device.

The case may include a communications interface door assembly including a communications interface door plug, wherein the communications interface door plug is configured to engage in a communications interface aperture in the boot sidewall of the boot. The communications interface door assembly may include a flexible hinged portion attached to the posterior portion and including a plug mating portion that receives the communications interface door plug. The communications interface door plug may be rigid.

A boot for use in a case for a portable electronic device may include a rear panel and a sidewall extending from the rear pane. The side wall may include fastener apertures configured to receive a corresponding plurality of fasteners, an audio port hollow region located to allow access to an audio port of the portable electronic device, an audio port aperture located to allow access to the audio port hollow region, an acoustic piping aperture located to allow sound to enter the audio port hollow region even when the audio port aperture is plugged, a microphone aperture located to allow sound to pass through the sidewall to reach a microphone of the portable electronic device, a speaker aperture located to allow sound emanating from a speaker of the portable electronic device to pass through the sidewall, a communications interface aperture located to allow access to a communications port of the portable electronic device, and at least one actuator.

The boot may also include an anterior portion groove configured to receive a ridge of an anterior portion, and a posterior portion groove configured to receive a ridge of a posterior portion.

The sidewall may include hollow regions separated by partitions. The partitions may comprise a truss. The sidewall may also include an audio port cover recess configured to accept a portion of an audio port cover. The sidewall further may also include vibration switch actuator apertures located to receive a vibration switch actuator. The sidewall may also include a stop nub located to engage with an ON detent and an OFF detent of the vibration switch actuator. The sidewall may also include a plurality of wiper seals proximate the plurality of vibration switch actuator apertures, wherein the plurality of wiper seals are configured to form a seal with the vibration switch actuator.

The rear panel may also include a rear window and a rear window seal on the front surface of the rear panel around the rear window.

BRIEF DESCRIPTION OF THE FIGURES

FIGS. 1A-1G illustrate different views of a portable electronic device case, according to techniques of the present application.

FIG. 3 illustrates an audio port cover of a portable electronic device case, according to techniques of the present application.

FIGS. 4A and 4B illustrate a vibration switch actuator and a portion of a boot of a portable electronic device case, according to techniques of the present application.

Figure 1A:
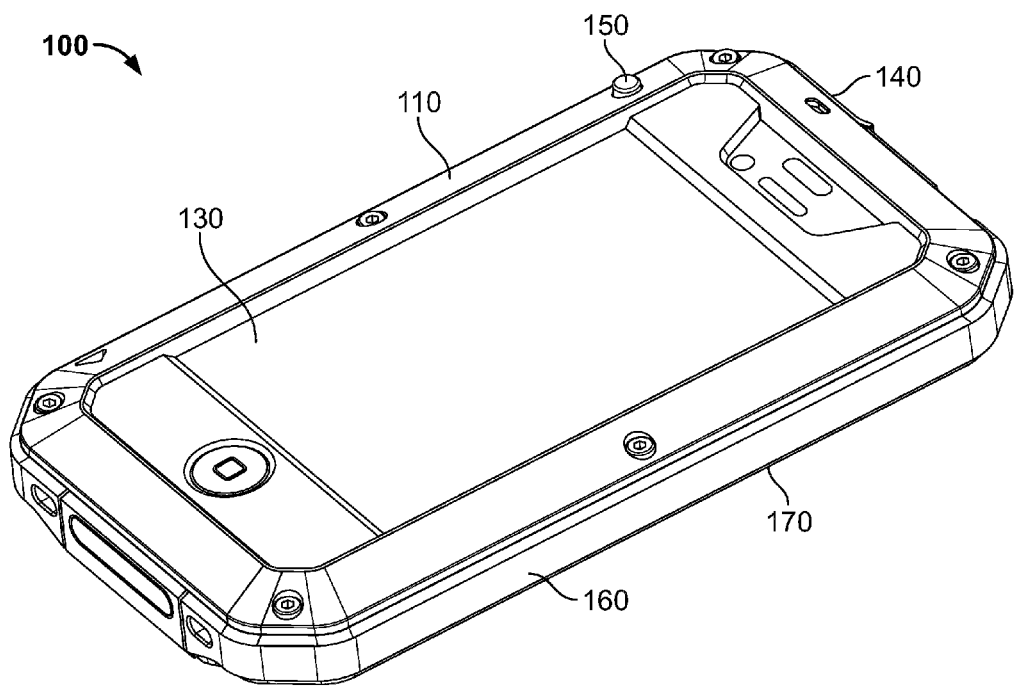

The foregoing summary, as well as the following detailed description of certain techniques of the present application, will be better understood when read in conjunction with the appended drawings. For the purposes of illustration, certain techniques are shown in the drawings. It should be understood, however, that the claims are not limited to the arrangements and instrumentality shown in the attached drawings. Furthermore, the appearance shown in the drawings is one of many ornamental appearances that can be employed to achieve the stated functions of the system.

DETAILED DESCRIPTION

For purposes of continuity, this application generally refers to a case 100. However, specific attributes of the case 100 may stand alone or may be part of a case having different attributes from case 100 or a case having only some of the attributes of case 100.

Figure 1B:
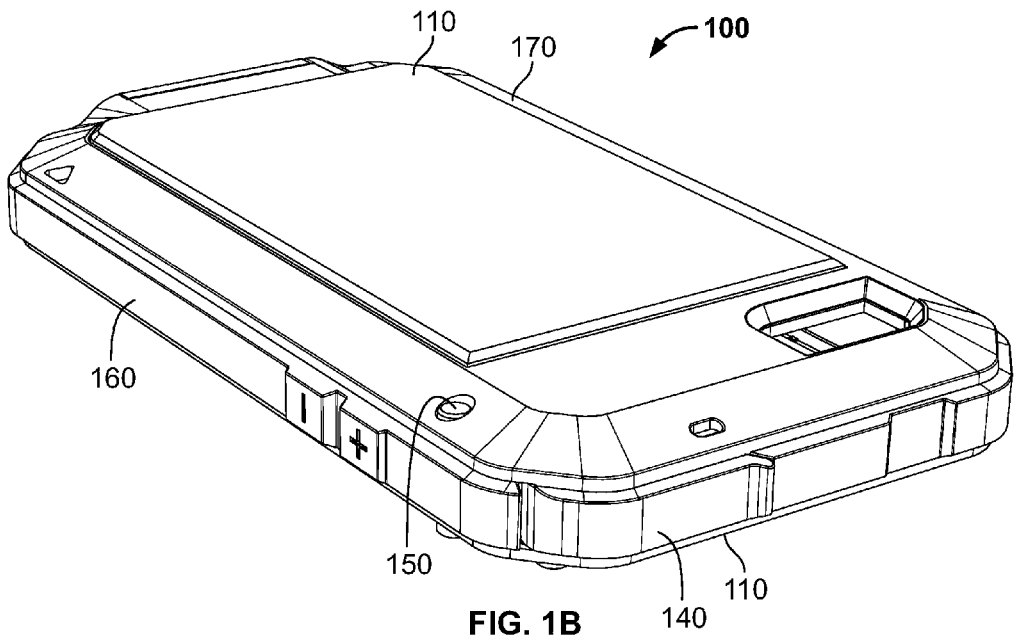
Figure 1E:
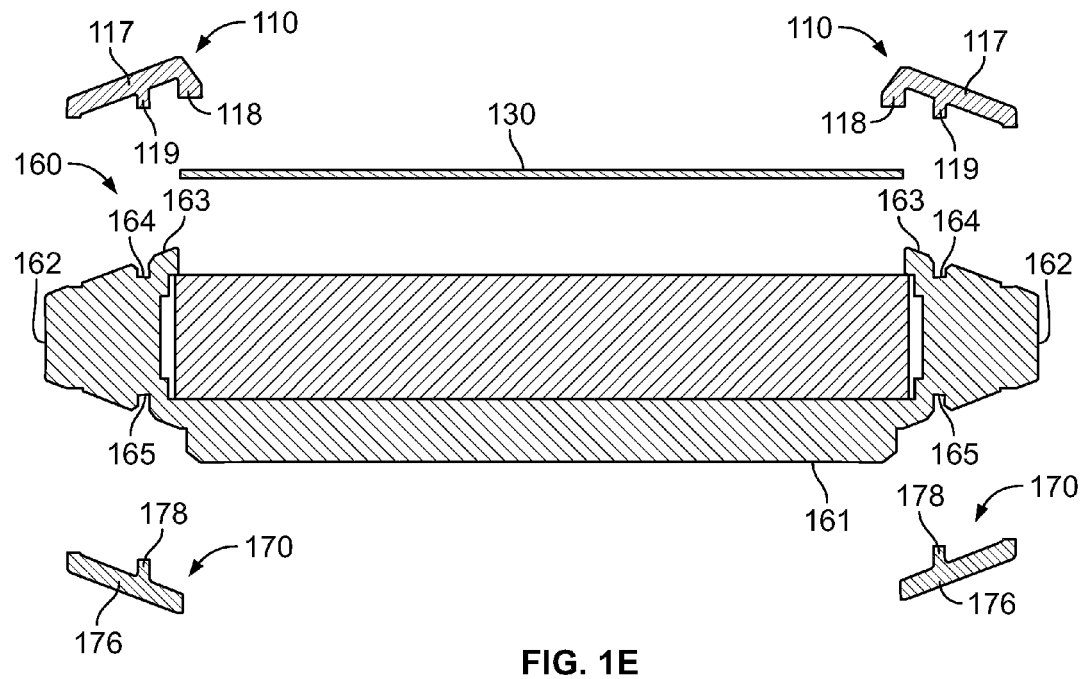
Figure 1F:
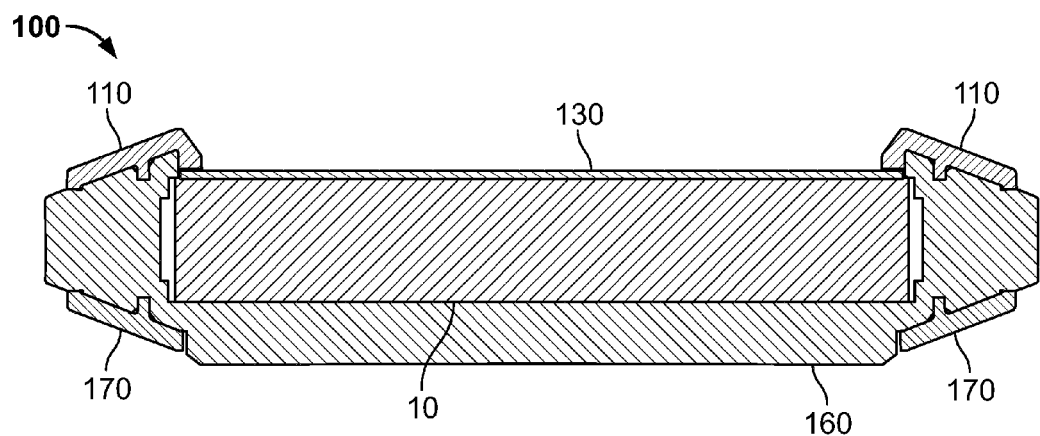
Figure 1G:
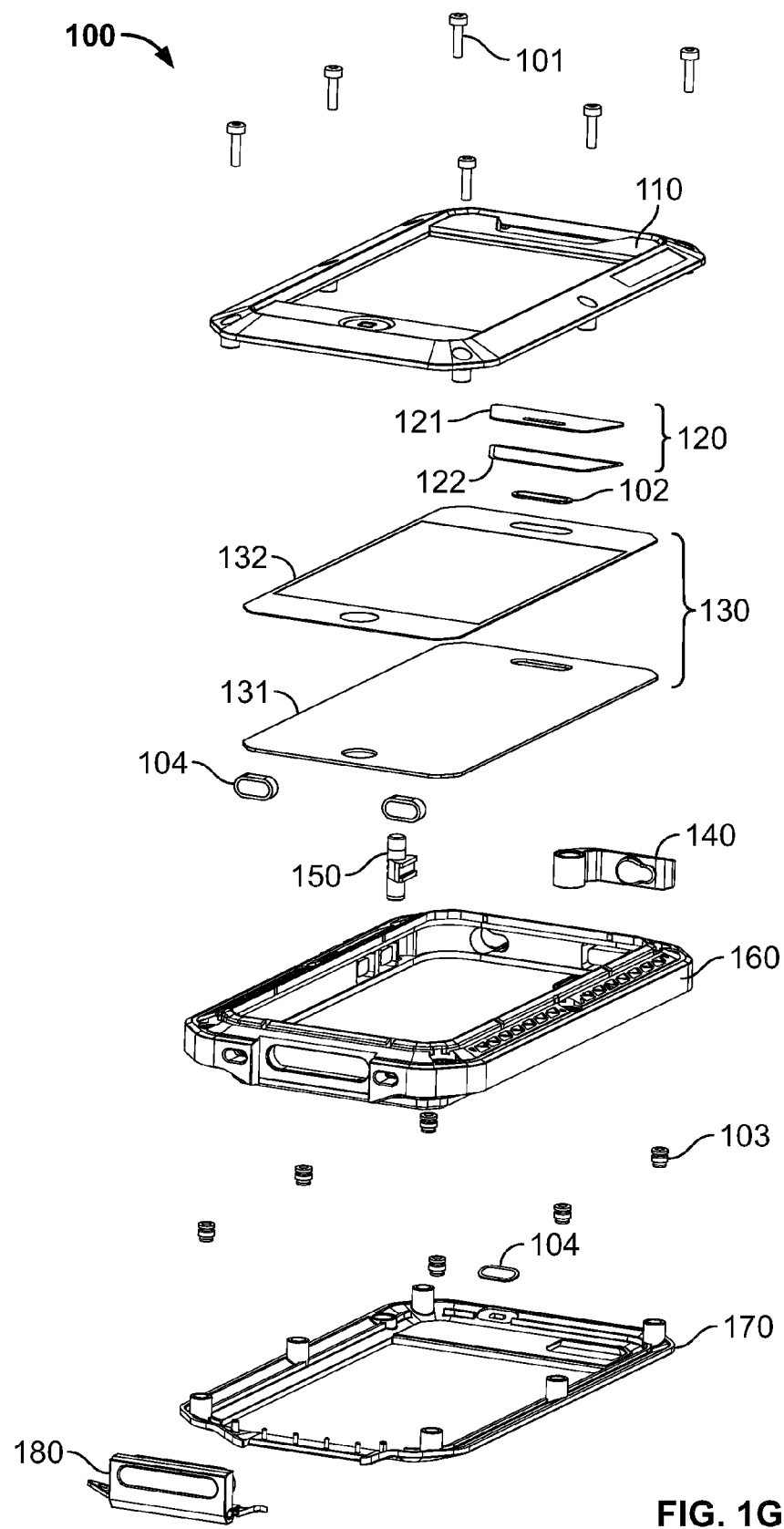
Figure 2A:
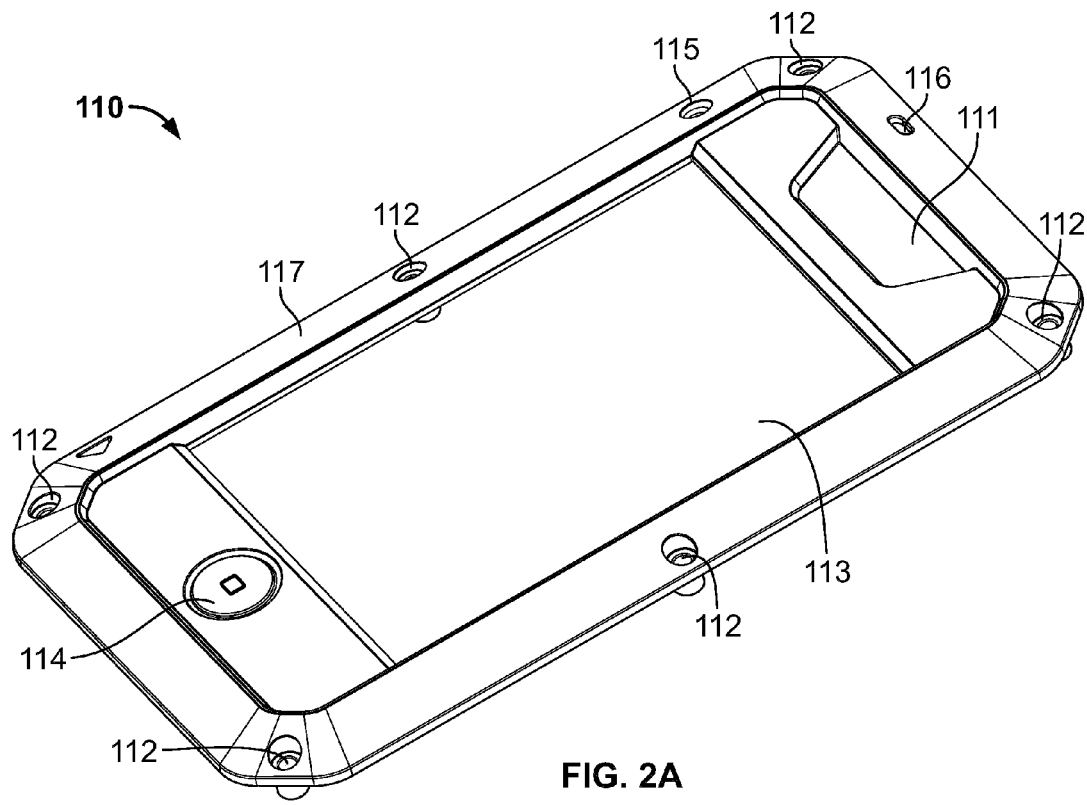
FIGS. 2A and 2B illustrate an anterior portion of a portable electronic device case, according to techniques of the present application.
Figure 2B:
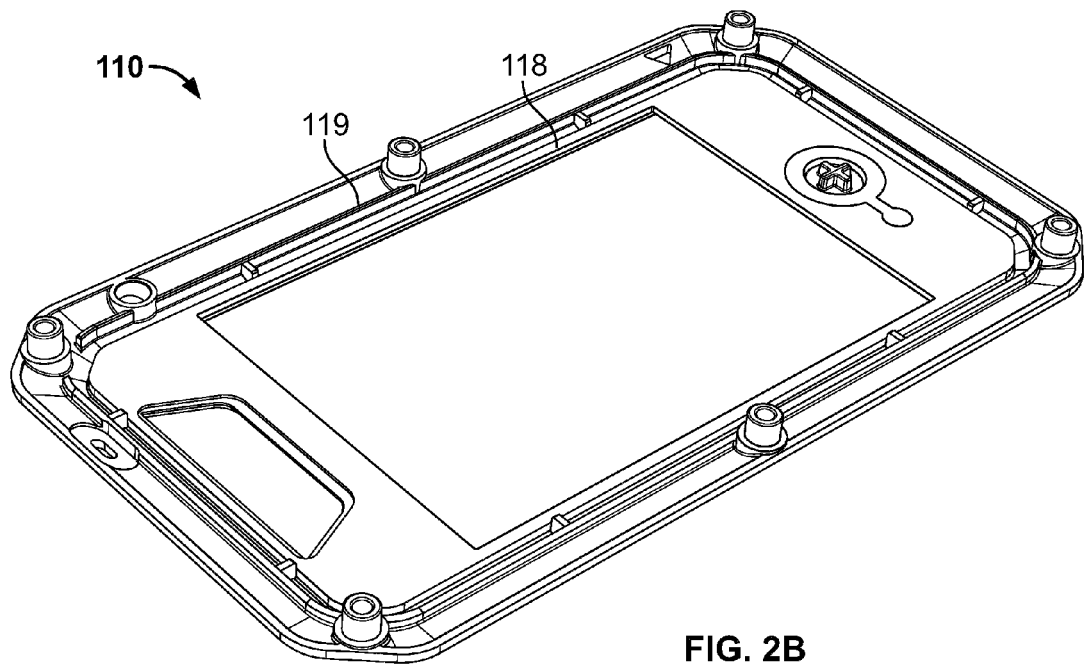

FIGS. 1A-1G illustrate different views of a portable electronic device case 100 (or, more simply, "case"), according to techniques of the present application. FIG. 1A is a perspective view of the front of the case 100. FIG. 1B is a perspective view of the rear of the case 100. FIG. 1C is an elevation view of the front of the case 100. FIG. 1D is an elevation view of the rear of the case 100. FIG. 1E is an exploded cross-sectional view of the case 100. FIG. 1F is a cross-sectional view of the case 100. FIG. 1G is an exploded perspective view of the case 100.

The case 100 may include an anterior portion 110, a receiver lens 120, a transparent covering portion 130, an audio port cover 140, a vibration switch actuator 150, a boot 160, a posterior portion 170, and a communications interface door assembly 180. The case 100 may be designed to accommodate a portable electronic device 10 (or, more simply, "device"), such as a smart phone. While not limiting, the figures generally show a case 100 that accommodates the iPhone® 4 or 4S.

Generally, the case 100 may protect the device 10 from contamination. The device 10 may fit into the boot 160. The transparent covering portion 130 may be aligned over the screen of the device 10. The anterior and posterior portions 110, 170, may sandwich the boot 160 and the transparent covering portion 130. Thus, the boot 160 and the transparent covering portion 130 may be between the anterior portion 110 and posterior portion 170. By "between," it should be understood that the boot 160 and the transparent covering portion 130 need not be completely between or directly abutting the anterior portion 110 and/or posterior portion 170. The boot 160 and transparent covering portion 130 may be between the anterior portion 110 and the posterior portion if only a portion of the boot 160 and transparent covering portion 130 is between the anterior portion 110 and/or the posterior portion 170. The boot 160 and transparent covering portion 130 may be between the anterior portion 110 and/or the posterior portion 170 if the boot 160 and transparent covering portion 130 are between only a portion of the anterior portion 110 and/or the posterior portion 170. Fasteners 101 (for example, bolts or socket head bolts) may be used to compress the device 10 and different parts of the case 100 together to enclose the device 10.

As shown in FIGS. 1E and 1F, the device 10 may fit in the boot 160. The anterior portion 110 and the posterior portion 170 may fit on or mate with the boot 160. The transparent covering portion 130 may lie over the device 10. The anterior portion 110 may include a lip 118 that compresses the transparent covering portion 130 onto the screen of the device 10 as the fasteners 101 are tightened.

As shown in FIG. 1G, the receiver lens 120 may include a lens 122 (for example, acrylic or polycarbonate) and an adhesive 121. The transparent covering portion 130 may include a lens 131 (for example, Gorilla Glass®) and an adhesive 132. The case 100 may include various coverings 104 which may substantially protect the device 10 from contaminants. One or more of the coverings 104 may be substantially acoustically transparent or transmissive. Such coverings 104 may include a material such as Gore GAW324.

The boot 160 is illustrated in greater detail in FIGS. 1E, 1F, 5A and 5B. The boot 160 may include a rear panel 161, a sidewall 162, a flange 163, and grooves 164. The rear panel 161 may fit against the back of the device 10. The rear panel 161 may include a rear window 161b and a rear window seal 161a. The rear window 161b may allow access (for example, access for light, sound, or touch) to a camera or light source on the device 10. The rear window seal 161a may form a seal (to protect against contaminants) with the device 10 in response to the rear window seal 161a being compressed against the device 10.

The sidewall 162 may wrap around the lateral sides of the device 10. There may be a flange 163 that extends from a top region of the sidewall 162. The rear panel 161, sidewall 162, and flange 163 may form a cavity. Outer regions of the device 10 may fit into the cavity, thereby securing the boot 160 to the device 10. The boot 160 may include a material such as an elastomer. For example, the boot 160 may include silicone. The boot 160 may be relatively flexible or may have a hardness of approximately 65 as measured by a durometer on a Shore A scale. The boot 160 may be formed as one unitary piece. The boot 160 itself may be used as a case, for example, without the anterior portion 110, transparent covering portion 130, and/or posterior portion 170.

Figure 5A:
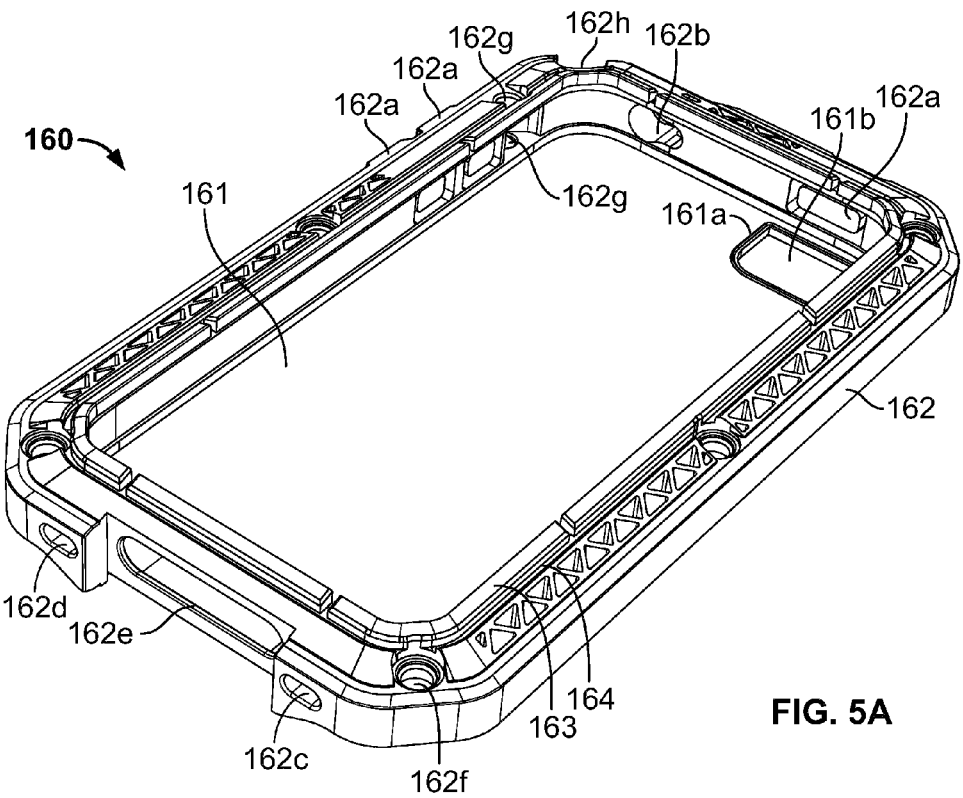
FIGS. 5A and 5B illustrate different views of a boot portion of a portable electronic device case, according to techniques of the present application.

The sidewall 162 may or may not be solid. The sidewall 162 may include hollow regions. Also, the inner and outer contours of the sidewall 162 may include nooks, crannies, or other uneven contours. At least some of these areas may be considered to be part of the sidewall 162. For example, as can be seen in FIG. 5A, a hollow area on the inside of the sidewall 162 can be seen proximate the vibration switch actuator apertures 162g. This hollow region and the parts above and below this hollow region may be considered part of or included in the sidewall 162.

The sidewall 162 may include one or more actuators 162a. Each actuator 162a may be pressed or released by a user to cause corresponding switches or buttons on the device 10 to be pressed or released. For example, the actuators 162a may interface with volume control or power control buttons or switches on the device 10. Each actuator 162a may receive an actuation force from a user. The actuator 162a may then translate the actuation force towards a switch or a button on the device 10.

The sidewall 162 may include an audio port aperture 162j, which opens into a hollow region 162b to allow access to an audio port (for example, a headset jack socket) in the device 10. The device 10 may have a microphone proximate to the audio port. This microphone may be used in conjunction with noise cancellation processes to improve audio quality (for example, call quality) from the device. The audio port aperture 162j may allow access to this microphone as well. If the audio port aperture 162j is sealed (for example, with the plug 142 of the audio port cover 140), the microphone may not effectively receive ambient noise. Consequently, the device 10 may not be able to perform effective noise cancellation.

To address this issue, the boot 160 may include one or more acoustic piping apertures 162i into the hollow region 162b—for example, one acoustic piping aperture 162i on the front side of the boot 160 and one acoustic piping aperture 162i on the back side of the boot 160. The acoustic piping aperture 162i may allow sound to pass into the hollow region 162b and to the microphone proximate the audio port, even when the audio port aperture 162j is sealed. Corresponding acoustic piping apertures 116, 175 may be provided in the anterior portion 110 and posterior portion 170 respectively. Thus, the apertures 116, 175, and 162i may allow noise cancellation to continue working even when the audio port aperture 162j has been sealed, for example, with the plug 142 of the audio port cover 140.

To protect against contamination entering through the acoustic piping aperture(s) 162i, microphone hole coverings 104 may be used in conjunction with the acoustic piping apertures 162i. These coverings 104 may be substantially acoustically transparent or transmissive. Such coverings 104 may include a material such as Gore GAW324. On the back side, a hole covering 104 may fit between the boot 160 and the posterior portion 170 (for example, in a recessed area around a corresponding acoustic piping aperture in the posterior portion 170). On the front side, a hole covering 104 may fit between the boot 160 and anterior portion 110 (for example, in a recessed area around a corresponding acoustic piping aperture in the anterior portion 110).

The sidewall 162 may include a speaker aperture 162c and a microphone aperture 162d. These apertures 162c, 162d may allow sound to pass to and from a microphone or speaker on the bottom of the device 10. The speaker aperture 162c and microphone aperture 162d may accommodate coverings 104. These apertures may also accommodate inserts that carry the coverings. The coverings 104 may be secured in the boot 160 by inserting them into the apertures 162c, 162d from the inside of the boot 160 and then inserting the carriers into the apertures 162c, 162d from the inside. The apertures 162c, 162d may include ledges in the boot 160 that prevent the coverings 104 and carriers from being inserted too far into the boot 160 (or coming out the other side).

The sidewall 162 may include a communications interface aperture 162e that allows access to a communications port on the device 10 (for example, a 30-pin communications port). The sidewall 162 may also include a plurality of fastener apertures 162f that accommodate the fasteners 101 or accommodate the risers on the anterior portion 110. Note, risers could also be on the posterior portion 170 or could be separate portions altogether. The sidewall 162 may include a plurality of vibration switch actuator apertures 162g (one on the front and one on the back) and an audio port cover recess 162h.

The sidewall 162 may also include a bumper 166. The bumper 166 may extend along any part of the sidewall 162. As shown, the bumper 166 extends along portions of the left, right, and top portions of the sidewall 162 of the boot 160. The bumper 166 may include air pockets or hollow regions 166b within the sidewall 162 of the boot 160. The bumper 166 may make the case 100 more shock resistant to impacts (for example, lateral-side impacts). The appearance of the bumper 166 shown in the drawings is one of many ornamental appearances of a bumper 166 that may be employed to achieve improved shock resistance.

Figure 5B:
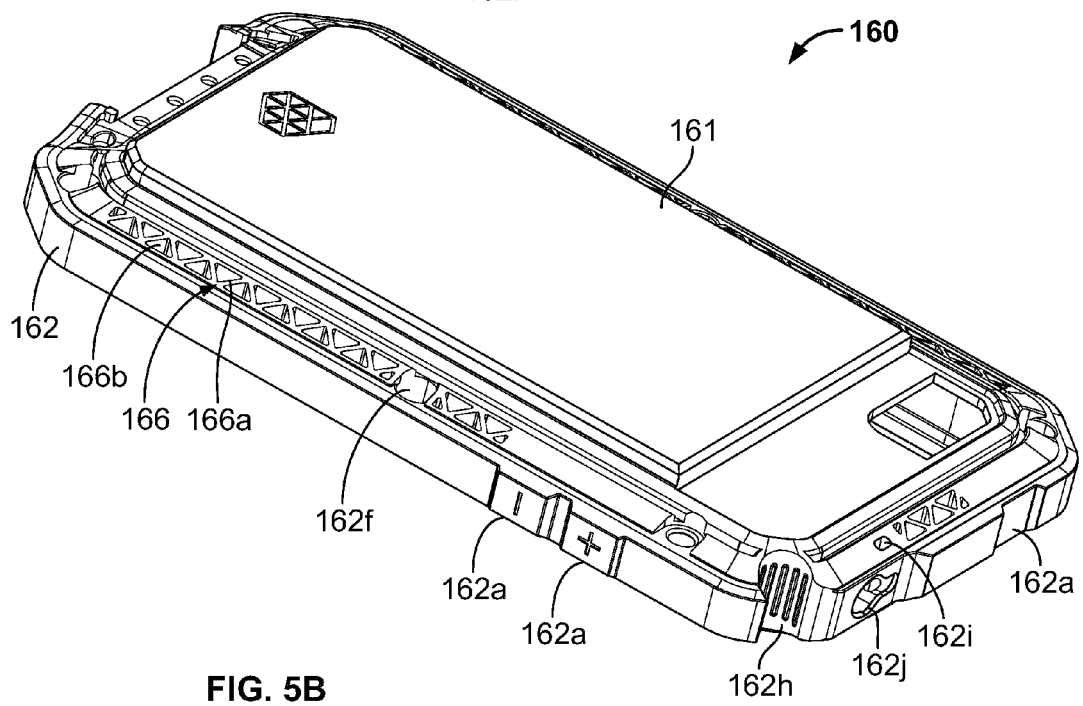
Figure 8:
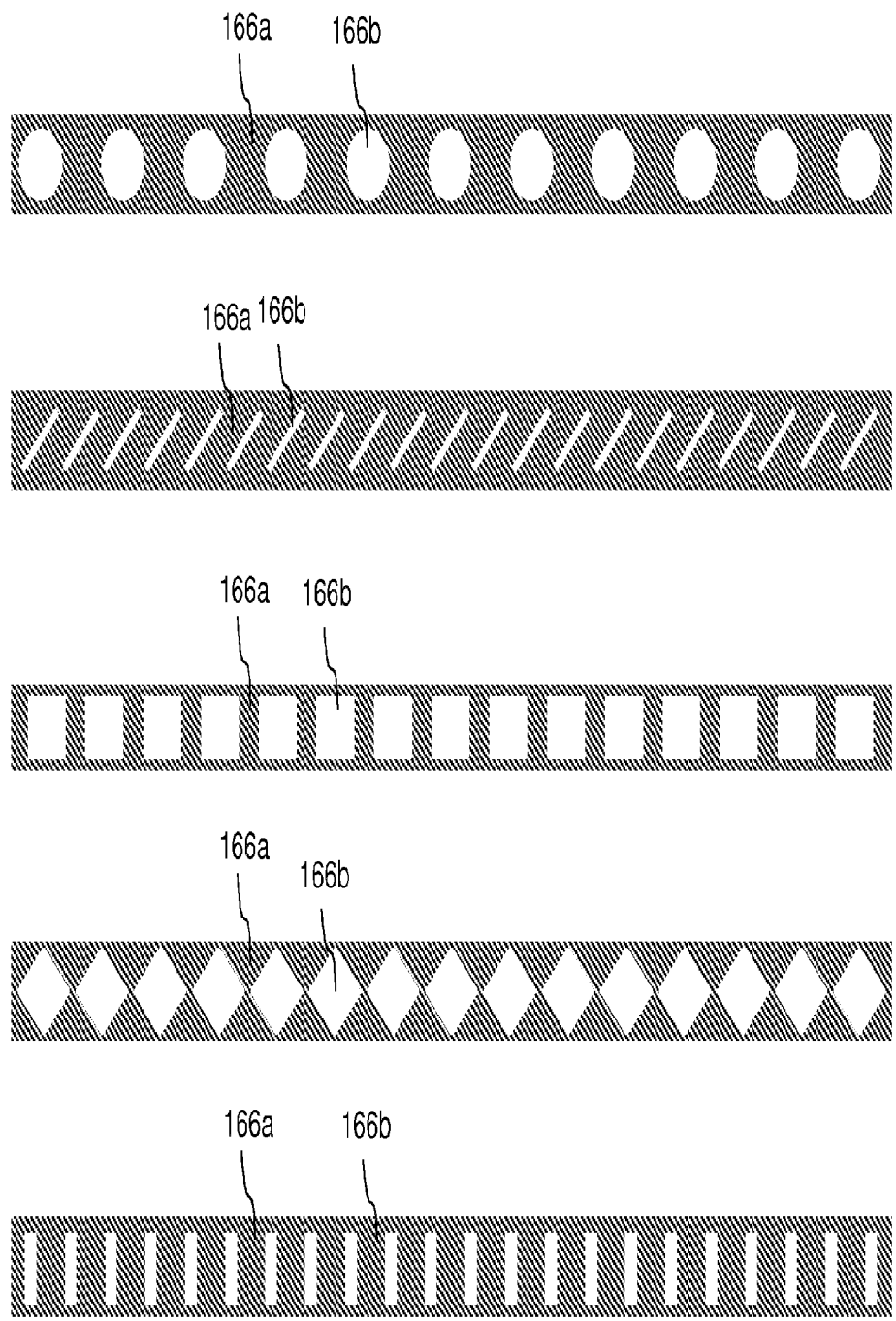
FIG. 8 illustrates a plurality of different example embodiments of the bumper of the sidewall of the boot including hollow regions having different shapes.

As shown in FIGS. 5A and 5B, the bumper 166 may have a trussed design with partitions 166a (for example, trussed or zigzagging partitions) separating the hollow regions 166b. As shown in FIG. 8, the bumper 166 may have other designs, such as air pockets 166b that are circular areas, diagonal line areas, rectangular areas, diamond areas, and straight line areas. The shape of the hollow regions 166b may determine the shape of the partitions 166a. These are just a few illustrative examples. Various other shapes (either regular or irregular) or combinations of shapes may be used.

The anterior portion 110 is illustrated in FIGS. 1E, 1F, 2A and 2B. The anterior portion 110 may include a receiver window 111 and fastener apertures 112. The receiver window 111 may provide access (for example, access for light, sound, or touch) to an earpiece speaker and/or camera of the device 10. The fastener apertures 112 may receive fasteners 101 (for example, bolts). A fastener aperture 112 may include a riser portion and a cup portion. An elongated portion of a fastener 101 may extend through the riser portion, while a head of the fastener may rest in the cup portion.

The anterior portion 110 may also include a screen window 113 and an actuator 114. The screen window 113 may provide access (for example, access for light, sound, or touch) to a screen of the device 10 or to the transparent covering portion 130. A user may interact with the screen of the device 10 through the screen window 113. The actuator 114 may be pressed or released by a user to cause a corresponding switch or button on the device 10 to be pressed or released. The actuator 114 may receive an actuation force from a user. The actuator 114 may then translate the actuation force towards a switch (for example, a home button) on the portable electronic device 10.

The anterior portion 110 may include a vibration switch actuator aperture 115 and an acoustic piping aperture 116. The vibration switch actuator aperture 115 may receive a post 151 of a vibration switch actuator 150. The acoustic piping aperture 116 may operate in conjunction with a corresponding acoustic piping aperture 162i of the boot 160. The operations and configurations of these apertures will be discussed in greater detail below.

The anterior portion 110 may include a bezel 117, a lip 118, and a ridge 119. The bezel 117 may have a beveled profile and may slope downwards from the top elevation of the anterior portion 110 towards the boot 160. As can be seen in FIGS. 1E and 1F, the lip 118 may extend downwards from the top elevation of the anterior portion 110. The lip 118 may be configured to extend past the flange 163 of the boot 160. The bottom surface of the lip 118 may compress an outer region of the transparent covering portion 130 against the device 10. The ridge 119 may be configured to mate with a corresponding groove 164 in the boot 160. The ridge 119 may include one or more ribs which also mate with the corresponding groove 164.

The audio port cover 140 is illustrated in FIG. 3. The audio port cover 140 may include an audio port cover 140 aperture 143 and an arm 141. A portion of the audio port cover around the aperture 143 may fit within the audio port cover recess 162h in the boot 160. The audio port cover aperture 143 may secure to another portion of the case 100, such that the arm 141 may rotate about the audio port cover aperture 143 and along a primary plane of the boot 160. A fastener 101 or a riser encompassing a fastener may extend through the audio port cover aperture 143.

The audio port cover 140 may also include a handle 144 and a plug 142. The handle 144 may facilitate the operation of opening and closing the audio port cover 140. When at one extent of the rotation of the audio port cover arm 141, the plug 142 may engage in the audio port aperture 162j of the boot 160 so that the audio port of the device 10 may be protected from contaminants.

The vibration switch actuator 150 is illustrated in in FIG. 4A. The vibration switch actuator 150 may include a post 151, a vibration switch cup 152, and vibration switch detents 153. The vibration switch cup 152 may be located on or within a lateral side of the post 151. The vibration switch cup 152 may be configured to receive a vibration switch on the device 10. The detents 153 may be located on or within the post 151. The detents 153 may include an ON detent and an OFF detent.

The vibration switch actuator 150 is illustrated in conjunction with the boot 160 in FIG. 4B. The boot 160 may accommodate the vibration switch actuator 150 through the vibration switch actuator apertures 162g. The vibration switch actuator 150 may slidably move transversely across the sidewall 162 as the post 151 slides through the vibration switch actuator apertures 162g. The boot 160 may include wiper seals 168 near or as part of the vibration switch actuator apertures 162g. The wiper seals 168 protect against contaminants by forming a seal and wiping contaminants off of the post 151 as the post 151 moves across the wiper seals 168.

The boot 160 may include a stop nub 167 that engages the detents 153. The stop nub 167 may alternately snap into the ON detent 153 or the OFF detent 153 as the vibration switch actuator 150 moves transversely across the sidewall 162. The stop nub 167 may assist in stopping movement of the vibration switch actuator 150. The vibration switch cup 152 may also assist in stopping movement when it abuts the boot 160. When the stop nub 167 snaps into a detent 153, it may cause a physical pulse. Such a pulse may provide tactile feedback to a user to indicate a change in position of the vibration switch actuator 150 and the corresponding vibration switch on the device 10.

Figure 6:
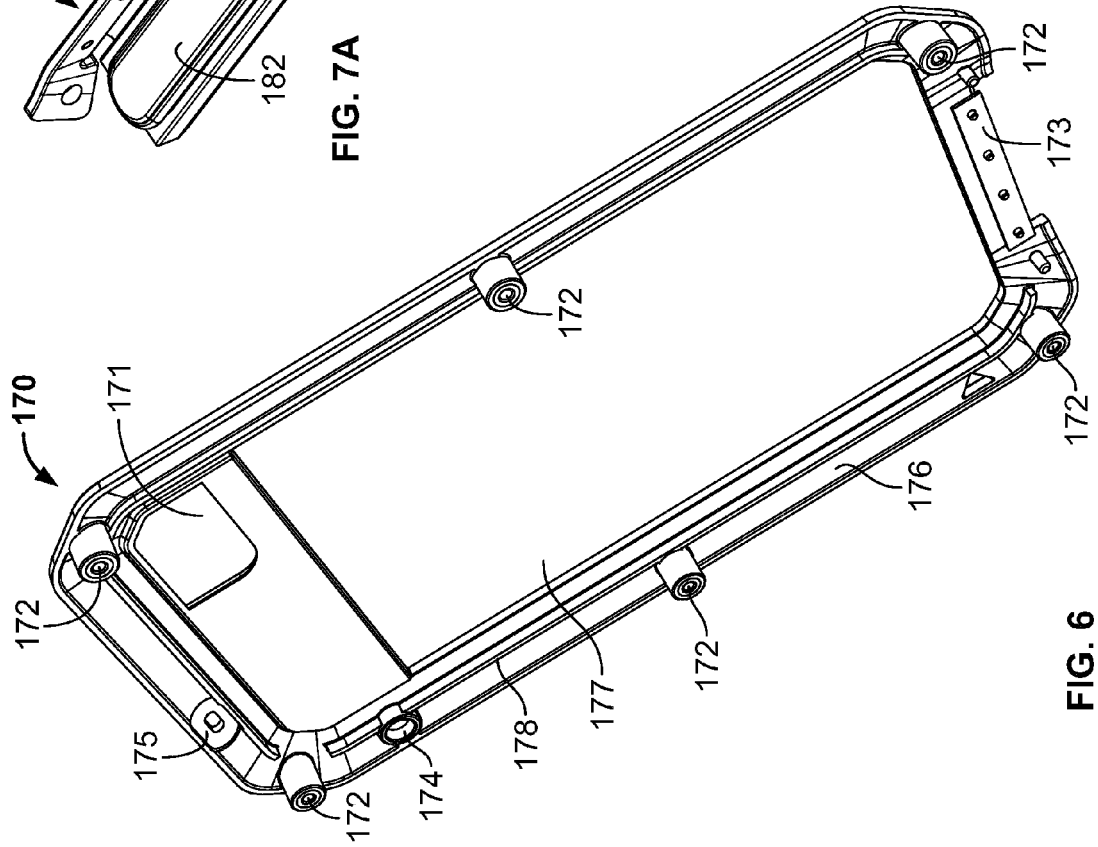
FIG. 6 illustrates a posterior portion of a portable electronic device case, according to techniques of the present application.

The posterior portion 170 is illustrated in FIG. 6. The posterior portion 170 may include a rear aperture 171 and fastener receptacles 172. The rear aperture 171 may provide access (for example, access for light, sound, or touch) to a camera or light source on the back of the device 10. The fastener receptacles 172 may be threaded, and may receive the fasteners 101. The fastener receptacles may also receive inserts (shown, for example, as 103 in FIG. 1G), which, in turn, receive the fasteners 101. While the case 100 is illustrated with fastener heads accessible from the front of the case 100, it would also be possible to reverse the fasteners 101 and corresponding portions on the anterior portion 110 and the posterior portion 170, such that the fastener heads are accessible from the back of the case 100.

The posterior portion 170 may also include a ridge 178. As can be seen in FIGS. 1E and 1F, the ridge 178 may be configured to mate with a corresponding groove 165 in the boot 160. The ridge 178 may include one or more ribs which also mate with the corresponding groove in the boot 160.

The posterior portion 170 may also include a communication door assembly connecting portion 173, a vibration switch actuator aperture 174, and an acoustic piping aperture 175. The communication door assembly connecting portion 173 may connect with the communication door assembly 180. The vibration switch actuator aperture 174 may correspond to a similar aperture 162g in the boot 160, and may accommodate the post 151 of the vibration switch actuator 150. The acoustic piping aperture 175 may correspond to a similar aperture 162i in the boot 160.

The posterior portion 170 may also include a bezel 176 and a window 177 to accommodate a rear panel 161 of the boot 160. The bezel 176 may have a beveled profile and may slope upwards from the bottom elevation of the anterior portion 110 towards the boot 160. The window 177 may allow the rear panel 161 of the boot 160 to be directly accessible to a user.

Figure 7A:
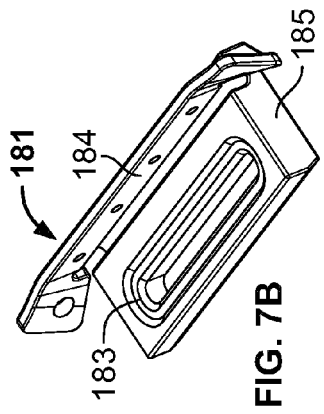
FIGS. 7A-7C illustrate a communications interface door assembly of a portable electronic device case, according to techniques of the present application.
Figure 7B:
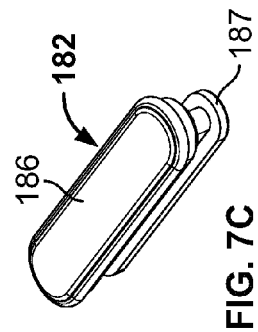
Figure 7C:
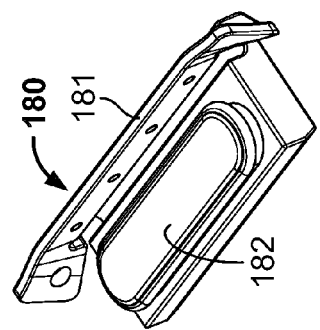

The communications interface door assembly 180 is illustrated in FIGS. 7A-7C. The communications interface door assembly 180 may include a hinged portion 181 and a plug 182. The hinged portion 181 may include a connecting portion 184, a door 185, and a plug receiving portion 183 configured to receive the plug 182. The hinged portion 181 may be flexible and may include a material such as silicone. The hinged portion may include a living hinge between the connecting portion 184 and the door 185. The connecting portion 184 may connect with the corresponding connecting portion 173 on the posterior portion 170.

The door 185 may include the plug receiving portion 183 which is configured to receive the plug 182. The plug 182 may be rigid. The plug 182 may include a material such as anodized aluminum. The plug 182 may include a door mating portion 187 that mates with the plug receiving portion 183 on the door 185. The plug 182 may also include a port cover portion 186 that fits through the communication port aperture 162e of the boot 120 and covers the communications port on the device 10.

It will be understood by those skilled in the art that various changes may be made and equivalents may be substituted without departing from the scope of the novel and non-obvious techniques disclosed in this application. In addition, many modifications may be made to adapt a particular situation or material to the teachings of the novel techniques without departing from its scope. Therefore, it is intended that the novel techniques not be limited to the particular techniques disclosed, but that they will include all techniques falling within the scope of the appended claims.

The invention is claimed as follows:

1. A flexible boot for at least partially encompassing an electronic device, said flexible boot comprising:
   a rear panel; and
   a sidewall extending from the real panel, the sidewall including an inner surface, an outer surface, and a plurality of compressible hollow regions positioned between the inner surface and the outer surface, the rear panel and the inner surface of the sidewall at least partially defining a cavity configured to receive the electronic device.

2. The flexible boot of claim 1, wherein the sidewall includes a plurality of lateral sides each including at least one of the plurality of hollow regions, the plurality of lateral sides of the sidewall extending parallel to a plurality of lateral sides of the electronic device when the electronic device is received into the cavity.

3. The flexible boot of claim 1, wherein at least one of the hollow regions extends completely through the sidewall.

4. The flexible boot of claim 1, wherein the plurality of compressible hollow regions extend into the side wall in a direction parallel to the inner surface.

5. The flexible boot of claim 1, wherein the rear panel includes a front surface and at least a portion of the front surface of the rear panel is configured to support the electronic device when the electronic device is received into the cavity.

6. A flexible boot for at least partially encompassing an electronic device, said flexible boot comprising:
   a rear panel; and
   a sidewall extending from the rear panel and including a plurality of lateral sides, the rear panel and the sidewall at least partially defining a cavity configured to receive the electronic device, the sidewall including a compressible bumper along at least a portion of each of the lateral sides, the compressible bumper including a plurality of hollow regions.

7. The flexible boot of claim 6, wherein the plurality of lateral sides of the sidewall extend parallel to a plurality of lateral sides of the electronic device when the electronic device is received into the cavity.

8. The flexible boot of claim 6, wherein at least one of the hollow regions extends completely through the sidewall.

9. The flexible boot of claim 8, wherein the rear panel includes a front surface, and wherein at least one of the hollow regions extends in a direction parallel to a plurality of lateral sides of the electronic device when the electronic device is received into the cavity.

10. The flexible boot of claim 6, wherein the rear panel includes a front surface, and wherein at least a portion of the front surface of the rear panel is configured to support the electronic device when the electronic device is received into the cavity.

11. A case for housing an electronic device, the electronic device having a screen, a back side, and a plurality of lateral sides offsetting the screen from the back side, said case comprising:
    an elastomeric boot including a sidewall, the elastomeric boot being configured to receive the electronic device such that the lateral sides of the electronic device are at least partially surrounded by the sidewall; and
    a rigid posterior portion defining an opening therethrough through which a portion of the elastomeric boot extends.

12. The case of claim 11, wherein the elastomeric boot further comprises a rear panel having a front surface and a back surface.

13. The case of claim 12, wherein the portion of the elastomeric boot that extends through the opening includes the back surface of the rear panel.

14. The case of claim 12, wherein at least a portion of the front surface of the rear panel is configured to support the back side of the electronic device when the electronic device is received into the elastomeric boot.

15. The case of claim 12, wherein the sidewall of the elastomeric boot extends from the rear panel.

16. The case of claim 15, wherein the sidewall includes an inner surface, an outer surface, and a plurality of compressible hollow regions positioned between the inner surface and the outer surface, the rear panel and the inner surface of the sidewall at least partially defining a cavity configured to receive the electronic device.

17. The case of claim 16, wherein at least one of the plurality of hollow regions extends parallel to the lateral sides of the electronic device when the electronic device is received into the cavity.

18. The case of claim 17, wherein at least one of the hollow regions extends completely through the sidewall.

19. The case of claim 11, further comprising a rigid anterior portion attachable to the rigid posterior portion with the elastomeric boot therebetween.

20. The case of claim 11, wherein the sidewall includes an inner surface, an outer surface, and a plurality of compressible hollow regions positioned between the inner surface and the outer surface.

* * * * *